United States Patent
Ivanov et al.

(10) Patent No.: US 7,248,055 B2
(45) Date of Patent: Jul. 24, 2007

(54) ELECTROSTATIC DISCHARGE TRANSIENT AND FREQUENCY SPECTRUM MEASUREMENT OF GAP DISCHARGE

(75) Inventors: Vsevolod Ivanov, Austin, TX (US); Steve L. Williams, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 11/314,371

(22) Filed: Dec. 20, 2005

(65) Prior Publication Data

US 2007/0139050 A1    Jun. 21, 2007

(51) Int. Cl.
*G01R 29/12* (2006.01)
(52) U.S. Cl. ...................... 324/457; 324/456
(58) Field of Classification Search ............... 324/457, 324/464, 456
See application file for complete search history.

(56) References Cited

U.S. PATENT DOCUMENTS 5,430,604 A * 7/1995 Wong ..................... 361/230
5,510,705 A * 4/1996 Langrish ................. 324/158.1
5,543,727 A * 8/1996 Bushard et al. ............. 324/760
2004/0034993 A1* 2/2004 Rybka et al. ................. 29/623
2004/0108857 A1* 6/2004 Jarski et al. ................. 324/464

OTHER PUBLICATIONS

JEDEC, Electrostatic Discharge (ESD) Sensitivity Testing Human Body model (HBM), JEDEC Standard, JESD22-A114-B, Revision of JESD22-A114-A), Jun. 2000, 15 pages, JEDEC Solid State Technology Association 2000, Arlington, Virginia.

* cited by examiner

*Primary Examiner*—Walter Benson
(74) *Attorney, Agent, or Firm*—Haynes and Boone, LLP

(57) ABSTRACT

An electrostatic discharge testing system includes a measurement chamber to hold a discharge electrode and a target electrode in separation from each other, a first conductive path to supply an ESD pulse to the discharge electrode, and a second conductive path to receive a discharge pulse from the target electrode. A transmission line, field-coupled to the second conductive path, generates a measurement signal in response to the discharge pulse.

16 Claims, 3 Drawing Sheets

ELECTROSTATIC DISCHARGE TRANSIENT AND FREQUENCY SPECTRUM MEASUREMENT OF GAP DISCHARGE

BACKGROUND

The description herein relates to information handling systems and electrostatic discharge testing related to such systems.

As the value and use of information continue to increase, individuals and businesses seek additional ways to process and store information. One option available to users is information handling systems. An information handling system ("IHS") generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An electrostatic discharge (ESD) is the transfer of an electric charge from one object to another, through contact between the two objects or through spark (charge flow through an ionized conductive channel formed in a gas under high electric fields). The initial potential difference between the two objects may be hundreds or thousands of volts, which is rapidly reduced as charge is transferred between the objects.

Various information handling systems electronic components, such as integrated circuits, are sensitive to electrostatic discharge. An ESD pulse that enters an integrated circuit may cause temporary or permanent circuit malfunction, e.g., by breaking through thin insulating layers, triggering latch-up in CMOS devices, and short-circuiting reverse-biased PN junctions. The ESD pulse may be a primary discharge (e.g., from a human to a circuit board) or a secondary discharge, between two system components, that occurs after a primary discharge to one of the two components. Consequently, design at the circuit, device, component, and system level can benefit from efforts to avoid, mitigate, and/or harmlessly dissipate electrostatic discharges that may occur during assembly or operation of an information handling system. As circuits, circuit boards, and systems scale to smaller sizes, ESD management generally becomes more critical.

Device test conditions and ESD waveforms have been specified for several modeled ESD events. Common modeled ESD events include the human body model (HBM), the human-holding-a-metallic-object system-level model (HMM), the machine model (MM), and the charged device model (CDM). ESD pulse generators capable of generating pulses according to such models exist, and are used to test components and/or entire information handling systems. Device sensitivity is generally different for each type of modeled ESD event.

SUMMARY

An electrostatic discharge testing system comprises a measurement chamber to hold a discharge electrode and a target electrode in separation from each other, a first conductive path to supply an ESD pulse to the discharge electrode, and a second conductive path to receive a discharge pulse from the target electrode. A transmission line, field-coupled to the second conductive path, generates a measurement signal in response to the discharge pulse.

DETAILED DESCRIPTION

For purposes of this disclosure, an information handling system ("IHS") includes any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
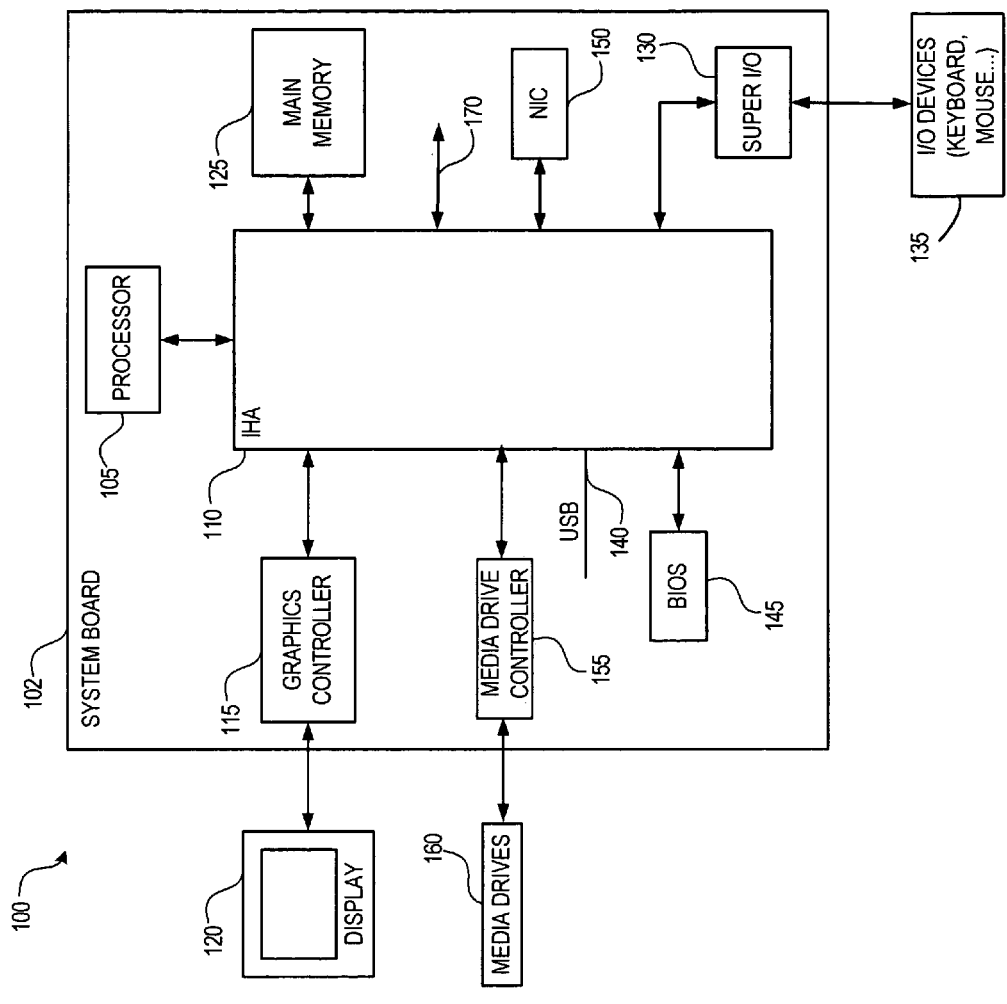
FIG. 1 is a block diagram illustrating an embodiment of an information handling system.

FIG. 1 is a block diagram of one typical information handling system ("IHS"). The IHS 100 includes a system board 102. The system board 102 includes a processor 105 such as an Intel Pentium series processor or one of many other processors currently available. An Intel Hub Architecture (IHA) chipset 110 provides the IHS system 100 with graphics/memory controller hub functions and I/O functions. More specifically, the IHA chipset 110 acts as a host controller that communicates with a graphics controller 115 coupled thereto. A display 120 is coupled to the graphics controller 115. The chipset 110 further acts as a controller for a main memory 125, which is coupled thereto. The chipset 110 also acts as an I/O controller hub (ICH) which performs I/O functions. A super input/output (I/O) controller 130 is coupled to the chipset 110 to provide communications between the chipset 110 and input devices 135 such as a mouse, keyboard, and tablet, for example. A universal serial bus (USB) 140 is coupled to the chipset 110 to facilitate the connection of peripheral devices to system 100. System basic input-output system (BIOS) 145 is coupled to the chipset 110 as shown. The BIOS 145 is stored in CMOS or FLASH memory so that it is nonvolatile.

A local area network (LAN) controller 150, alternatively called a network interface controller (NIC), is coupled to the chipset 110 to facilitate connection of the system 100 to other IHSs. Media drive controller 155 is coupled to the chipset 110 so that devices such as media drives 160 can be connected to the chipset 110 and the processor 105. Devices that can be coupled to the media drive controller 155 include CD-ROM drives, DVD drives, hard disk drives, and other fixed or removable media drives. An expansion bus 170, such as a peripheral component interconnect (PCI) bus, PCI express bus, serial advanced technology attachment (SATA) bus or other bus is coupled to the chipset 110 as shown. The expansion bus 170 includes one or more expansion slots (not shown) for receiving expansion cards which provide the IHS 100 with additional functionality.

Not all information handling systems include each of the components shown in FIG. 1, and other components not shown may exist. As can be appreciated, however, many systems are expandable, and include or can include a variety of components. The system board is generally mounted in a case that may also enclose various peripherals, and possibly the display 120. Most cases contain several ports to provide connection points for peripherals, power, networks, etc. For information handling systems that consume a significant amount of power, cooling ports/vents also generally exist in the case.

The various existing ESD tests are useful in addressing conditions and waveforms encountered during IHS component handling and assembly when the component is most likely to be subjected to a primary ESD event. In contrast, when such tests are applied to a subassembly of or an entire information handling system, the objective is to determine how the system responds to waveforms encountered during system operation. Generally, an external test point on the system is selected, and an ESD tester is triggered while in contact with (a contact discharge) or near (an arc discharge) exposed metal at the test point. If the system continues to perform normally after the ESD event, it is deemed to have successfully survived the encounter. If the system malfunctions or fails, further analysis is conducted in an attempt to determine where the system failed.

It has now been determined that under system test, a variety of complex factors determine if/how an ESD pulse applied to a system couples to each system component. Whether the ESD pulse injected at the test point is a contact or arc discharge, it can cause a secondary arc discharge between two points interior to the system. Secondary discharges can result in more severe arc currents than, for instance, an initial human body model discharge, because the resistance of the metallic part is much smaller than that of the human body. It has now been determined that such a secondary arc discharge can create radio frequency (RF) energy, with a frequency spectrum exceeding 1 GHz, that directly or indirectly excites I/O cables, apertures, circuit board traces, etc. Such an ESD event can create an electric field with amplitudes of 4000 V/m at a distance of 100 mm from the ESD arc, and an intense magnetic field as well. The electric field can capacitively couple onto nearby signal traces, causing false signals to appear at device receivers. The magnetic field can inductively couple into wiring loops in the vicinity of the discharge. Long wires also act as receiving antennas in the presence of the RF energy. These effects can result in voltage/current pulses appearing in power, ground, and signal wiring throughout the system.

Many electrostatic discharges occur inside metallic enclosures. In this case, the RF waves from sparks may undergo multiple changes due to cavity resonances, superposition, and reflection. The RF signal spectrum resulting from an ESD pulse is thus dependent on the location of the source and the RF detector within the cavity. Often the RF radiation spectrum from an ESD spark discharge can provide an indication as to the part from which the ESD discharge emanated.

To control ESD events and optimize ESD protection methods, we believe that it is extremely helpful to be able to make meaningful ESD measurements that appropriately define the state of the gaps and geometry of a system. Particularly in situations where ESD can cause secondary discharge and resultant harmful effects, we now believe that measurements of transient duration and frequency spectrum of EMI noise for gap discharges can lead to a better understanding and solutions to ESD problems. To date, no repeatable ESD tests exist that allow detailed quantification of secondary discharges.

Figure 2:
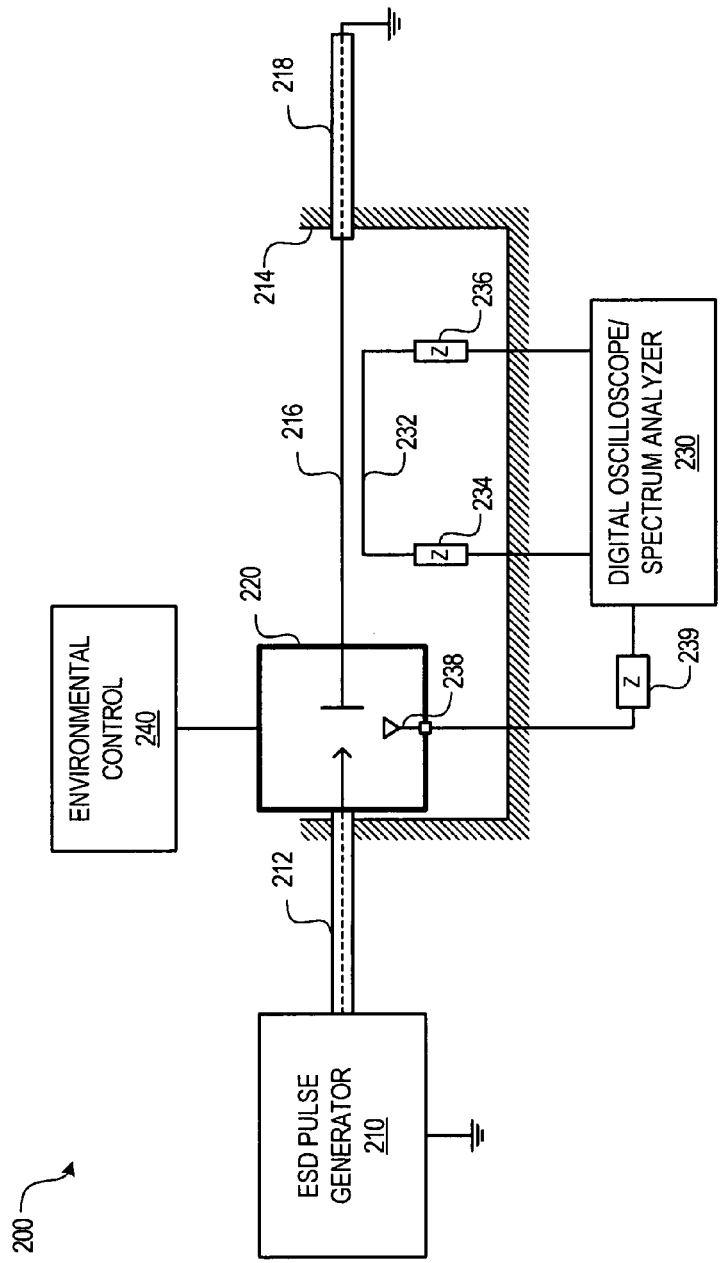
FIG. 2 illustrates the configuration of an ESD testing system.

FIG. 2 illustrates an embodiment of an ESD testing system 200. An ESD pulse generator 210 delivers ESD pulses according to a desired model, voltage, energy, etc. The ESD pulses travel down a conductive path comprising a coaxial cable 212 to a measurement chamber 220, which will be described in further detail below. The ESD pulses induce arc discharges within the measurement chamber, which are coupled out of chamber 220 on a conductive path comprising transmission line 216 and coaxial cable 218.

Within a system frame 214, a second transmission line 232 is field-coupled to transmission line 216. Transmission line 232 couples to a wideband digital oscilloscope and/or spectrum analyzer 230 through matching impedances 234 and 236. Optionally, an antenna 238 is routed into measurement chamber 220 in order to measure RF energy in the vicinity of the arc discharge. Antenna 238 also couples to spectrum analyzer 230 through a matching impedance 239.

Optionally, an environmental controller 240 can be connected to measurement chamber 220. The controller can control such parameters as temperature, humidity, gas composition, etc., in chamber 220.

Figure 3:
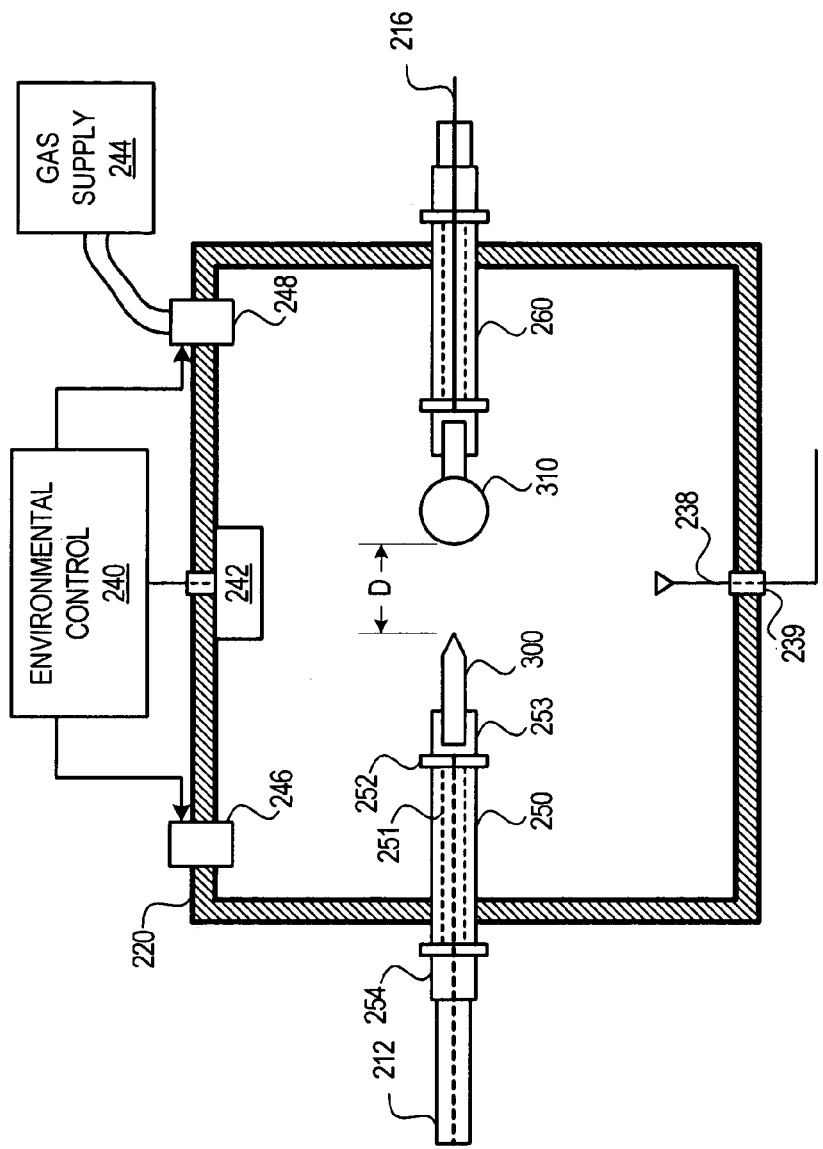
FIG. 3 contains additional detail for a testing chamber of the testing system of FIG. 2.

FIG. 3 shows further details of the measurement chamber 220. A discharge electrode 300 and target electrode 310 are separated by a distance D within the interior of chamber 220. In one configuration, electrodes 300, 310 are mounted respectively on threaded carriers 250, 260. Taking threaded carrier 250 as exemplary, the threaded carrier is threaded through a hole in the wall of chamber 220. The electrode 300 can be repositioned by rotating the carrier a desired number of turns inward or outward, thereby varying distance D in accordance with the thread pitch of the carrier. Advantageously, when used with an environmental control system, experiments with different values of D can thus be conducted without having to open the chamber to alter D, and consequently disturb the ambient environment.

Threaded carrier 250 is also fitted with an insulated wire 251 routed longitudinally through the carrier, a dielectric spacer 252, and two end fittings 253, 254. Insulated wire 251 carries ESD pulses into/out of measurement chamber 220. It attaches, at the end of carrier 250 that is exterior to the chamber, to a coaxial connector 254 to allow connection to a coaxial cable 212 or 216. At the end of carrier 250 that is interior to the chamber, insulated wire 251 attaches to end fitting 253. Fitting 253 is electrically insulated from threaded carrier 251 by the dielectric spacer 252, which is advantageous when threaded carrier 250 is electrically conductive. Fitting 253 can be a docking collar capable of holding one of a set of interchangeable electrodes, such as the needle electrode 300, spherical electrode 310, a cylindrical, planar, or hemispherical electrode (not shown), and other similar electrodes of different sizes. Other special electrode fittings, e.g., with clamp ends, can be used to hold more complex geometries such as actual IHS chassis parts, circuit boards, etc. ESD discharges from different electrode bodies can give different broad-band RF signal spectra, aiding investigation of the effect of real geometric features inside the IHS.

In one embodiment, an antenna 238 passes into chamber 220 through an antenna port 239. At the radio frequencies of interest during a spark discharge, antenna 238 should be less than a quarter-wave in length. Optionally, the antenna can use a threaded carrier or other means that allows it to be positioned at different distances from the spark discharge. Antenna 238 can be connected to an input of a digital oscilloscope and/or spectrum analyzer through a 50Ω coaxial cable (not shown).

Measurement chamber 220 can optionally be fitted with an environmental control system 240, as shown, or portions of such a system to control selected environmental variables. A thermal unit 242 comprises a thermal sensor and a heater/cooler, allowing tests to be run at a temperature selected using environmental control 240. Environmental control 240 can also control the ambient gas present in chamber 220, e.g., by controlling valves 246, 248, with valve 248 connected to a gas supply 244. Although any gas could be selected, gas supply 244 could for instance supply humid or dry air, with environmental control 240 adjusting valves 246 and 248 to achieve a desired humidity.

In operation, a desired test configuration is set, and one or more ESD pulses of a desired level and for a desired model are launched into the chamber to the discharge electrode. The ESD pulses cause an arc discharge to the target electrode. A digital oscilloscope and/or spectrum analyzer is set to trigger when the ESD pulse generator 210 generates an ESD pulse. The oscilloscope and/or spectrum analyzer then captures the RF signal from antenna 238, and the coupled discharge pulse from transmission line 232. The time waveforms and frequency spectra of the discharge pulses and fields can then be displayed, recorded, or tabulated for various test conditions.

Many other features of the described ESD measurement system may be varied as design parameters. For instance, chamber 220 may be insulated, grounded, connected to the pulse generator output, etc. The size of the chamber can be varied as desired in order to hold the desired electrodes in the desired separation ranges. Instead of a threaded fitting, electrodes can be attached for example to a sliding fitting attached to a micrometer.

Although illustrative embodiments have been shown and described, a wide range of other modification, change and substitution is contemplated in the foregoing disclosure. Also, in some instances, some features of the embodiments may be employed without a corresponding use of other features. Accordingly, it is appropriate that the appended claims be constructed broadly and in manner consistent with the scope of the embodiments disclosed herein.

What is claimed is:

1. An electrostatic discharge (ESD) testing system comprising:
 a measurement chamber to hold a discharge electrode and a target electrode in separation from each other;
 a first conductive path to supply an ESD pulse to the discharge electrode;
 a second conductive path to receive a discharge pulse from the target electrode;
 a transmission line, field-coupled to the second conductive path, to generate a measurement signal in response to the discharge pulse; and
 means for varying the separation distance between the discharge electrode and the target electrode;
 wherein the means for varying the separation distance between the discharge electrode and the target electrode can vary the separation distance while the chamber is substantially sealed; and
 wherein the means for varying the separation distance between the discharge electrode and the target electrode comprises at least one threaded carrier to hold one of the electrodes, the threaded carrier threaded through a wall of the chamber.

2. The ESD testing system of claim 1, further comprising an ESD pulse generator coupled to the first conductive path.

3. The ESD testing system of claim 1, further comprising an antenna within the measurement chamber, the chamber comprising an antenna port to allow a signal received by the antenna to be passed out of the chamber.

4. The ESD testing system of claim 1, wherein the chamber can be substantially sealed during ESD testing, the system further comprising an environmental controller to control at least one of the temperature and gas composition of the gas in the chamber.

5. The ESD testing system of claim 1, wherein the means for varying the separation distance between the discharge electrode and the target electrode comprises first and second threaded carriers, holding the discharge and target electrodes, respectively, each threaded carrier threaded through a wall of the chamber.

6. The ESD testing system of claim 5, wherein each threaded carrier comprises an insulated conductor passing longitudinally through the carrier, the insulated conductor of the first threaded carrier forming part of the first conductive path and the insulated conductor of the second threaded carrier forming part of the second conductive path.

7. The ESD testing system of claim 1, wherein the threaded carrier includes an end fitting to hold the held electrode, and wherein the held electrode is selectable between a plurality of interchangeable electrodes.

8. The ESD testing system of claim 7, wherein the interchangeable electrodes include at least two electrodes having tips selected from the group of tips comprising a needle tip, a spherical tip, a hemispherical tip, a planar tip, and a cylindrical tip.

9. A method of measuring an electrostatic discharge (ESD), the method comprising:
 relatively positioning a discharge electrode and a target electrode in a measurement chamber;
 supplying an ESD pulse to the discharge electrode;
 providing a current path to carry a discharge pulse from the target electrode;
 field-coupling a transmission line to the current path;
 measuring a signal induced on the transmission line by the discharge pulse;
 varying the relative positioning of the discharge electrode and the target electrode;
 supplying a second ESD pulse to the discharge electrode; and
 measuring a second signal induced on the transmission line.

10. The method of claim 9, further comprising:
 measuring an electromagnetic signal within the measurement chamber.

11. The method of claim 9, further comprising:
sealing the measurement chamber prior to supplying the ESD pulse to the discharge electrode; and
controlling at least one of the temperature and gas composition of the gas in the chamber.

12. The method of claim 9, wherein the measurement chamber is substantially closed during the supplying of an ESD pulse to the discharge electrode, and wherein the ESD pulse is supplied from an ESD pulse generator located outside of the measurement chamber, and the field-coupled transmission line is located outside of the measurement chamber.

13. An electrostatic discharge (ESD) testing device comprising:
a substantially sealable measurement chamber;
a discharge electrode and a target electrode relatively positioned in the chamber;
means for supplying an ESD pulse to the discharge electrode;
means for providing a current path to carry a discharge pulse from the target electrode;
a transmission line field-coupled to the current path;
means for measuring a signal induced on the transmission line by the discharge pulse;
means for varying the relative positioning of the discharge and target electrodes;
means for supplying a second ESD pulse to the discharge electrode; and
means for measuring a second signal induced on the transmission line.

14. The ESD testing device of claim 13, further comprising means for measuring characteristics of the discharge pulse.

15. The ESD testing device of claim 13, further comprising antenna means disposed within the chamber for measuring an electromagnetic field of the discharge pulse.

16. The ESD testing device of claim 13, further comprising means for adjusting the relative positioning of the first and second electrode means within the chamber, while the chamber remains substantially sealed.

* * * * *